United States Patent [19]

Kawashima

[11] 4,234,812

[45] Nov. 18, 1980

[54] THICKNESS-WIDTH SHEAR QUARTZ CRYSTAL VIBRATOR

[75] Inventor: Hirofumi Kawashima, Tokyo, Japan

[73] Assignee: Kabushiki Kaisha Daini Seikosha, Tokyo, Japan

[21] Appl. No.: 929,027

[22] Filed: Jul. 28, 1978

[30] Foreign Application Priority Data

Dec. 7, 1977 [JP] Japan ................................ 52/146735

[51] Int. Cl.$^3$ ...................... H01L 41/08; H01L 41/18
[52] U.S. Cl. ..................................... 310/361; 310/366; 310/368
[58] Field of Search ........................ 310/361, 366, 368

[56] References Cited

U.S. PATENT DOCUMENTS

| | | | |
|---|---|---|---|
| 2,306,909 | 12/1942 | Sykes | 310/361 |
| 3,479,536 | 11/1969 | Norris | 310/361 X |
| 3,766,616 | 10/1973 | Staudte | 310/312 X |
| 3,792,294 | 2/1974 | Royer | 310/361 |
| 4,076,987 | 2/1978 | Zumsteg | 310/361 |
| 4,112,323 | 9/1978 | Kawashima | 310/348 |

Primary Examiner—Mark O. Budd
Attorney, Agent, or Firm—Robert E. Burns; Emmanuel J. Lobato; Bruce L. Adams

[57] ABSTRACT

A thickness-width shear quartz crystal vibrator, having each vibrating mode (p, q, r) respectively being (1, 1, 1), in which "p" is the number of crests of a sine wave form of polarization directed along its electrical axis, "q" is the number of crests of a cosine waveform of polarization directed along its thickness and "r" is the number of crests of cosine waveform of polarization directed along its width perpendicular to the said electrical axis. The vibrator is cut out from a Y-plate of quartz crystal at the angle between 34 to 36 degrees turned around the X-axis thereof and is provided with plural opposite electrodes on the vertical surface or the surface parallel to the y-axis thereof. Therefore, the said quartz crystal vibrator has a low equivalent impedance and also has an excellent frequency-temperature characteristic.

5 Claims, 15 Drawing Figures

THICKNESS-WIDTH SHEAR QUARTZ CRYSTAL VIBRATOR

BACKGROUND OF THE INVENTION

The present invention relates to a thickness-width shear quartz crystal vibrator suitable for use in an electronic wrist watch.

Recently, wrist watches have been using electronic components and thereby the timekeeping accuracies of these electronic wrist watches have been greatly improved. The flexural quartz crystal vibrator tuning fork has been used as a time-standard of the said electronic wrist watch. However, since the frequency-temperature characteristic of said flexural quartz crystal vibrator tuning fork has a quadratic characteristic curve, it is difficult to get highly accurate and stable resonance frequency which covers a wide temperature range. Therefore, by means of performing temperature compensation by using a barium titanate condenser, the electostatic capacitance thereof varies according to temperature, and quartz crystal wrist watches having passably high accuracy have been entering into practical use.

But, when the higher accuracy of a quartz crystal wrist watch is desired, it is necessary to adjust the temperature characteristics of both temperature the compensating condenser and quartz crystal vibrator to the optimum point. Moreover, it is impossible to increase the accuracy over a certain limit because the capacitance of the temperature compensating condenser varies with the lapse of time. Accordingly, an AT-cut quartz crystal vibrator, the frequency-temperature characteristic thereof having a cubic characteristic curve, has been drawing attention as a possible solution to the above problem, and the research and development thereof are continuously going on so as to be able to use it for wrist watches, however, it cannot be used as yet for wrist watches.

The AT-cut quartz crystal vibrator being developed has been a plane and rectangular element and both ends of the vibrator in the length direction have been finished into bevel shapes, and the electrodes for exciting have been provided on both top and bottom horizontal surfaces of the AT-cut quartz crystal vibrator. When an alternating voltage is impressed between the said electrodes for exciting, thickness-width shear vibrators can be maintained. Further, the distribution of polarization is to be taken into consideration in order to understand the vibrating modes of said rectangular AT-cut quartz crystal vibrator. When "p" indicates the number of crests of a sine waveform of polarization directed for its electrical axis (lengthy direction), "q" indicates the number of crests of a cosine waveform of polarization directed for its thickness and "r" indicates the number of cosine waveform of crests of a polarization directed for its width perpendicular to the said electrical axis. Thus, each vibrating mode can be indicated with (p, q, r).

The said rectangular AT-cut quartz crystal vibrator vibrates with the modes (p, q, r) being (1, 1, 0), so that if the rectangular AT-cut quartz crystal vibrator is miniaturized with said vibrating modes, it cannot be used for wrist watch since a number of spurious vibration are generated. Further, as for the vibrator of this type, it is theoretically impossible to vibrate with the vibrating modes (1, 1, 1) because each electrode is provided on the top and bottom surfaces in the thickness direction of the vibrator. Actually, however, the vibrator is able to be excited with vibrating modes (1, 1, 1) because the distribution of polarization thereof is not perfectly symmetrical. However, because of the characteristics of this vibrating mode, especially, since the equivalent impedance thereof is large and the Q-factor thereof is low, the said vibrator cannot be used for wrist watches.

SUMMARY OF THE INVENTION

It is an object of this invention to provide a thickness-width shear quartz crystal vibrator the equivalent impedance thereof is made small, by exciting the vibrator with the vibrating modes (p, q, r) being (1, 1, 1), by improving the cut-out angle, shape, size and the shape of electrodes of the quartz crystal vibrator. The resonance frequency of quartz crystal vibrator is decided by exciting with said vibrating modes (1, 1, 1) according to the thickness and width thereof, so that we call it by the name of thickness-width shear quartz crystal vibrator.

More specifically, another object of this invention is to provide a thickness-width shear quartz crystal vibrator having the excellent frequency-temperature characteristic by combining the cut-out angle, size and dimension thereof suitably.

A further object of this invention is to adjust the frequency of said vibrator easily without deteriorating the equivalent impedance thereof.

DETAILED DESCRIPTION OF THE PREFERRED EMBODIMENTS

Figure 1:
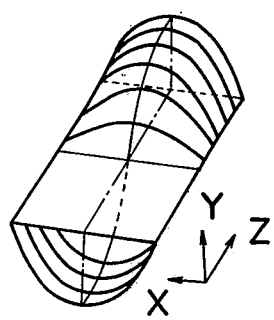
FIG. 1 is a diagram of the distribution of polarization of a thickness-width shear quartz crystal vibrator of this invention.

FIG. 1 shows the distribution of polarization of this invention. Namely, the vibration mode of the thickness-width shear quartz crystal vibrator according to the present invention is the same as that of a thickness-width shear vibration. The displacement of the vibrator is maximum at the center of the vibrator electrical axis (X-axis direction) and becomes smaller toward the both ends of the X-axis thereof. While in the direction perpendicular to the electrical axis X, the vibration becomes gradually smaller from opposite end portions of the vibrator and becomes finally zero (0) at the center point of the vibrator although the displacement of the vibrator is maximum at the center of the electrical axis and decreases going toward the both ends of the X-axis. And further, at opposite halves of the vibrator the vibration becomes gradually larger in inverse phases and finally becomes maximum at the both end portions thereof.

Figure 2:
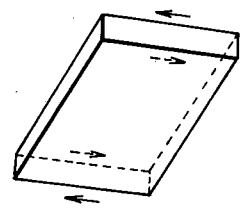
FIG. 2 is a perspective a view of thickness-width shear quartz crystal vibrator of this invention.

FIG. 2 shows the vibrating condition of the distribution of polarization shown in FIG. 1 so as to be understood more easily. Namely, the exciting electrode is provided so as to displace in the directions of the arrow marks shown in the drawing.

Figure 3:
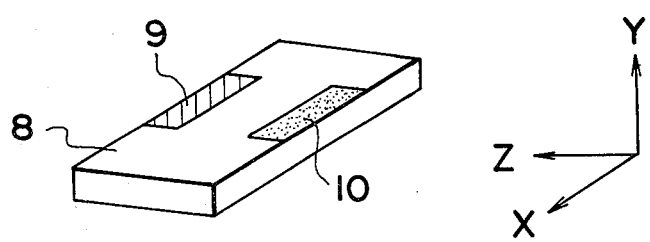
FIG. 3 is a general view of a thickness-width shear quartz crystal vibrator of this invention.

FIG. 3 is an embodiment of the electrode arrangement of the present invention. In order to simplify the description, a Y-plate is taken by way of an example. In FIG. 3, numeral 8 represents a thickness-width shear quartz crystal vibrator and numerals 9 and 10 represent electrodes for exciting which are arranged on the front surface of the vibrator, and 9 and 10 are divided into two pieces in the width direction of said vibrator. On the rear surface of the vibrator there are arranged two exciting electrodes as well (the rear electrodes are not shown in the drawing).

Figure 4:
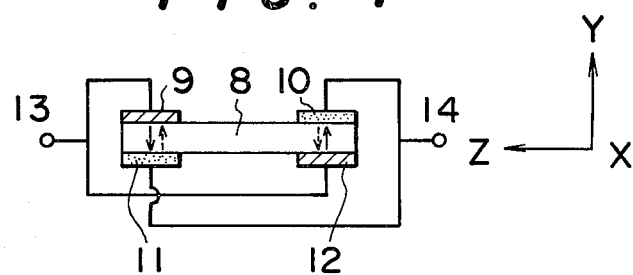
FIG. 4 is a sectional view of a thickness-width shear quartz crystal vibrator shown in FIG. 3.

FIG. 4 shows the structure of the electrodes of the quartz crystal vibrator shown in FIG. 3. In the drawing, the electrode 9 and an electrode 12, the electrode 10 and an electrode 11 have the same polarities. If an alternating voltage is applied to electrode terminals 13 and 14, the electric field is produced in the directions of the solid line arrow mark and dotted line arrow mark, and the displacements occur in inverse direction relative to each other as shown in FIG. 2. As a result the vibrating modes (1, 1, 1) can be easily obtained.

Figure 5:
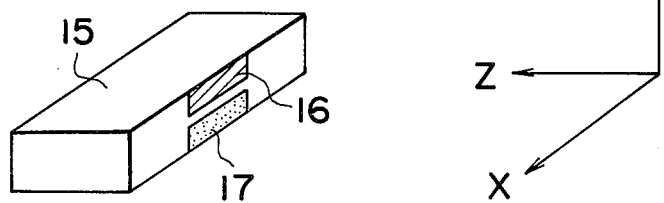
FIG. 5 is a general view showing another embodiment of a thickness-width shear quartz crystal vibrator of this invention.
Figure 6:
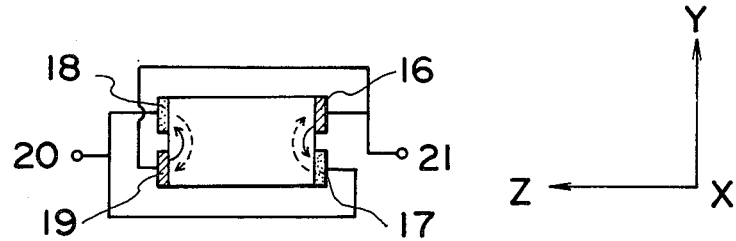
FIG. 6 is a sectional view of the thickness-width shear quartz crystal vibrator shown in FIG. 5.

FIG. 5 is another embodiment of electrodes arrangement. This example is arranged with two pairs of electrodes 16, 17, 18 and 19 (18 and 19 are not shown in the drawing). The arrangement of electrodes of this example is shown in FIG. 6, wherein the electrodes 16 and 19 have the same polarity and the electrodes 17 and 18 also have the same polarity. Now, if an alternating voltage is applied to the electrode terminals 20 and 21, the electric field is produced along the arrow mark directions and as a result the vibrating modes (1, 1, 1) can be easily obtained.

Figure 7:
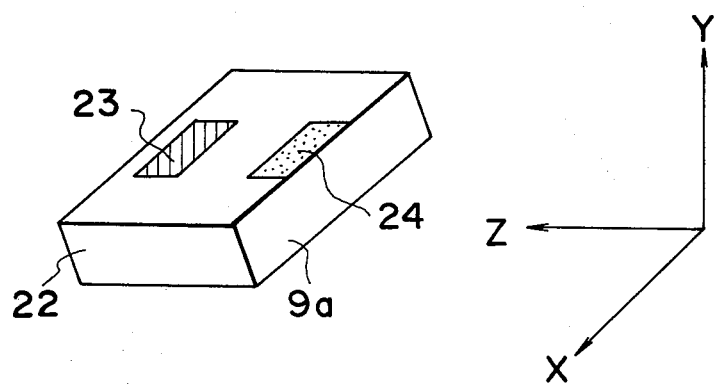
FIG. 7 is a general view showing another embodiment of a thickness-width shear quartz crystal vibrator of this invention.
Figure 8:
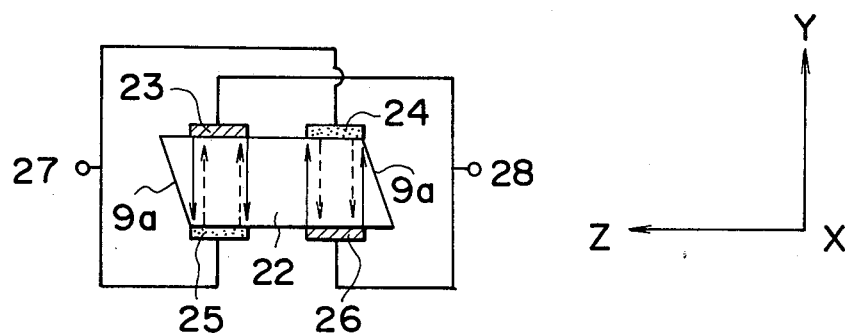
FIG. 8 is a sectional view of the thickness-width shear quartz crystal vibrator shown in FIG. 7.

FIGS. 7 and 8 show another embodiment of electrodes arrangement. In this example, the side surfaces 9a of thickness-width shear quartz crystal vibrator 22 do not make a right angle with the Z-axis thereof but are oriented with a certain inclination thereto. The angle of this inclination will be described later in detail. And in this example, electrodes 23 and 26 have the same polarity and electrodes 24 and 25 also have the same polarity. Further, the end portions of the electrodes 23 and 25, and the end portions of the electrodes 24 and 26 are arranged approximately in parallel with the Y-axis of said quartz crystal vibrator. This is because, since the component of an electric field to excite the quartz crystal vibrator is the component of +Y axis direction or −Y axis direction thereof, it is necessary to arrange the electrodes so as to produce the component of electric field of the same value within the same region. And numerals 27 and 28 in FIG. 8 are the electrode terminals.

Figure 9:
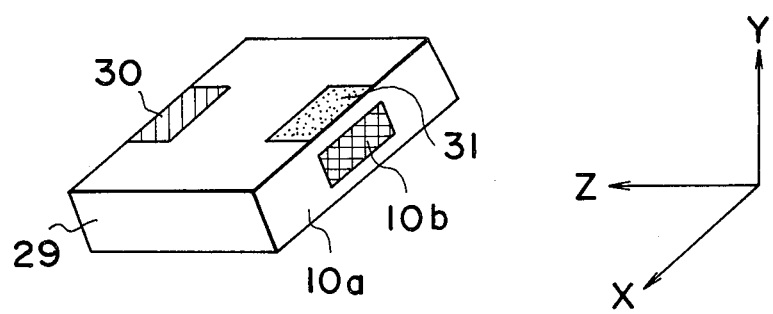
FIG. 9 is also a general view showing another embodiment of a thickness-width shear quartz crystal vibrator of this invention.
Figure 10:
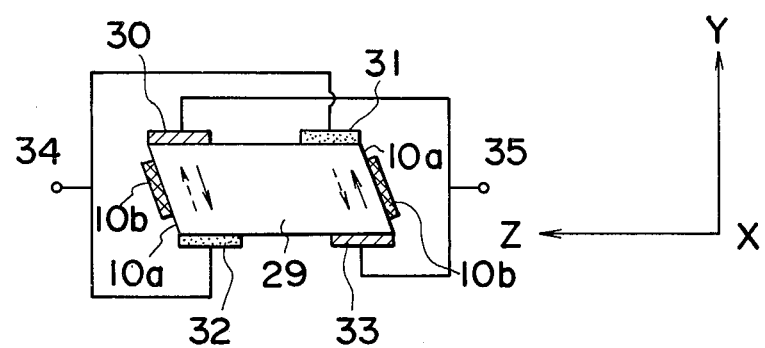
FIG. 10 is a sectional view of the thickness-shear quartz crystal vibrator shown in FIG. 9.

FIGS. 9 and 10 show another embodiment of electrodes arrangement of this invention. In this example, the side surfaces 10a of thickness-width shear quartz crystal vibrator do not make a right angle with the Z-axis thereof but are oriented with a certain inclination thereto as in the embodiment of FIGS. 7 and 8, and the front and rear electrodes 30 and 32, and 31 and 33 are arranged in contact with both ends of the width direction of the quartz crystal. And the said electrodes 30 and 32, and 31 and 33 are also arranged in parallel with and into correspondence with each other. Also provided are the resonance frequency adjusting elements 10b on the said inclined side surfaces 10a thereof. And, 34 and 35 in FIG. 10 are the electrode terminals. The reason that the resonance frequency can be adjusted will be described later in detail.

Figure 11:
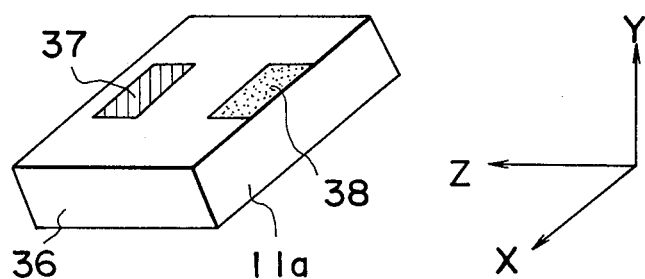
FIG. 11 is a general view showing another embodiment of a thickness-width shear quartz crystal vibrator of this invention.
Figure 12:
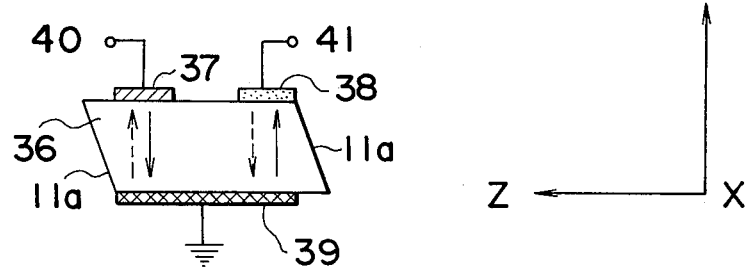
FIG. 12 is a sectional view of the thickness-width shear quartz crystal vibrator shown in FIG. 11.

FIGS. 11 and 12 are another embodiment of electrodes arrangement of this invention. This example shows a quartz crystal vibrator 36 having the same shape as shown in FIGS. 7 and 9, and two electrodes 37 and 38 are arranged spaced in the width direction thereof on one of the main surface (the front surface) of the said quartz crystal vibrator. On the other hand, an earth electrode 39 is arranged on the other main surface (the rear surface) thereof. In these figures 11a shows the side surfaces of said quarts crystal vibrator 36 which does not make a right angle with the Z-axis thereof but is oriented with a certain inclination thereto and numerals 40 and 41 show electrode terminals. Now, if an alternating voltage is applied to the electrode terminals 40 and 41, the electric field is produced along the arrow mark directions as shown in FIG. 11 and as a result the vibrating modes (1, 1, 1) can be easily obtained.

Next, the resonance frequency of the vibrating modes (1, 1, 1) of this invention will be described. It is well known that the displacement direction rotating axis of a thickness-width shear quartz crystal vibrator cut-out from a Y-plate of quartz crystal is parallel with the X-axis thereof. When the contour of the quartz crystal is extremely large compared with the thickness thereof, the equation to easily determine the resonance frequency thereof can be derived. However, for the dimensions considered in this invention, that is, a shape wherein the surface perpendicular to the thickness direction (main surface) thereof makes a right angle with the surface perpendicular to the width direction (side surface) thereof, the stress $z_x$ can not become zero in the surface perpendicular to the width direction thereof so that an exact solution could not before be derived. But the exact solution for a slightly different case has been discovered by Mr. R. D. Mindlin. Namely, if the main surface of the quartz crystal vibrator does not make a right angle with the side surface thereof but makes a certain angle, the stress $z_x$ becomes zero at the side surface, and thereby the exact solution has been obtained. By the above mentioned discovery, the quartz crystal vibrator could be further miniaturized.

Figure 13:
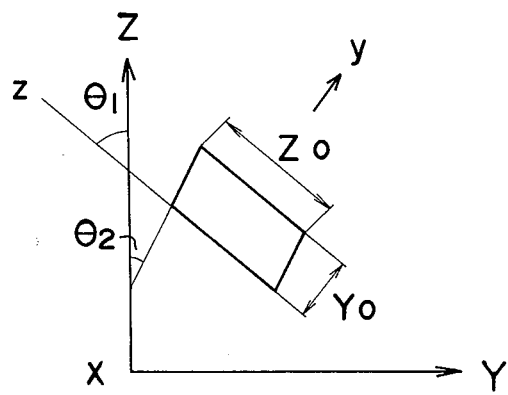
FIG. 13 is a diagram showing the cut-out angle of a thickness-width shear quartz crystal vibrator of this invention.

FIG. 13 shows a sectional view of the thickness-width shear quartz crystal vibrator cut out from the Y-plate, being $Y_o$ in thickness and $Z_o$ in width, at the angle $\theta_1$ to the main surface and at the angle $\theta_2$ to the side surface rotated around the X-axis thereof as a rotating axis. (The rotation in counter clockwise direction is defined positive) The x, y, z axes are respectively the new axes which rotated X-axis, Y-axis and Z-axis in a certain degree. In case of the vibrating modes (1, 1, 1), since the displacement is parallel with the x-axis and the displacement in the y-axis and z-axis directions is zero, the equation of motion can be expressed as follows:

$$C'_{66} \cdot \partial^2 U/\partial y^2 + 2C'_{56} \cdot \partial^2 U/\partial y \partial z + C'_{55} \cdot \partial^2 U/\partial z^2 = -\phi \omega^2 U \quad (1)$$

where;

$C'_{66}$, $C'_{56}$, $C'_{55}$ are elastic stiffnesses by cordinate transformation.

$\omega$ is angular velocity.

U is displacement in the x-axis direction.

$\phi$ is density of quartz crystal.

Also in the case of the vibrating modes (1, 1, 1), the displacement U can be expressed as follows;

$$U = \sin \tau y \cdot \sin \zeta (C'_{56}/C'_{66} \cdot y - z) \quad (2)$$

Equation (1) can be solved by putting into equation (2) as follows;

$$\phi \omega^2 = C'_{66} \tau^2 + \gamma_{55} \zeta^2 \quad (3)$$

where: $\gamma_{55} = C'_{55} - C'^2_{56}/C'_{66}$

Since the vibrating modes in this case is (1, 1, 1), the values of $\tau$ and $\zeta$ are respectively as follows;

$$\zeta = \pi/y_o, \tau = \pi/z_o \quad (4)$$

Further, the boundary conditions of side surfaces thereof are realized by the following relation:

$$90° - (\theta_1 - \theta_2) = \arctan (C'_{56}/C'_{66}) \quad (5)$$

That is, if the value of $\theta_1$ is determiend, the value of $\theta_2$ can be easily obtained. From equations (3) and (4), the resonance frequency "f" of the vibrating modes (1, 1, 1) can be shown as follows:

$$f = \tfrac{1}{2} Y_o (C'_{66}/\phi)^{\tfrac{1}{2}} (1 + \gamma_{55}/C'_{66} \cdot Y_o^2/Z_o^2)^{\tfrac{1}{2}} \quad (6)$$

Accordingly, the resonance frequency-temperature characteristic in case of changing the cut-out angle and the side-ratio thereof can be easily and theoretically gained by using equation (6).

The frequency f(t) at an optional temperature "t" is expressed to a cubic approximation with a Taylor series at room temperature 20° as follows:

$$f(t) \approx f(20)[1 + \alpha(t-20) + \beta(t-20)^2 + \gamma(t-20)^3]$$

$\alpha$, $\beta$, $\gamma$ are defined respectively as the linear, quadratic, cubic resonance frequency-temperature coefficients and are indicated as follows:

$$\alpha = \partial f(t)/\partial t/f(20), \beta = \partial^2 f(t)/\partial t^2/2f(20),$$
$$\gamma = \partial^3 f(t)/\partial t^3/6f(20) \quad (7)$$

The cut-out angle and the width-to-thickness ratio having the excellent resonance frequency-temperature characteristic could have been gained by computing $\alpha$, $\beta$, $\gamma$. And further $\theta_1$, $\theta_2$ are determined by the width-to-thickness ratio of a thickness-width shear quartz crystal vibrator. Accordingly, the angle of 34 to 36 degree is generally the most preferable value for the resonance frequency-temperature characteristic.

Figure 14:
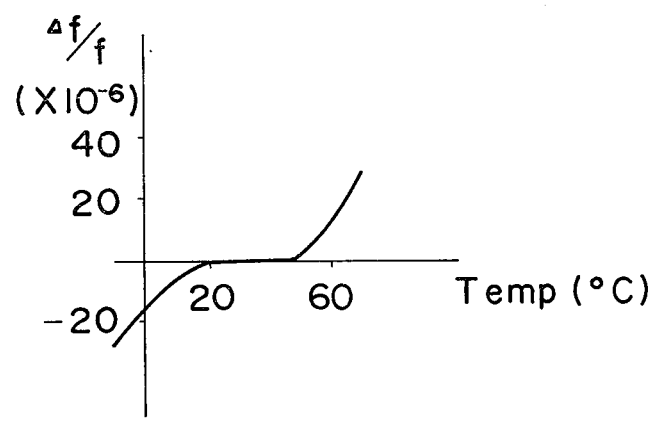
FIG. 14 is a diagram showing one example of the theoretical frequency-temperature characteristic of this invention.

FIG. 14 shows the resonance frequency-temperature characteristic of this invention by theoretical computation under the conditions that the width-to-thickness ratio Yo/Zo is 0.05 and the cut-out angle $\theta_1$ is 35°20', $\theta_2$ is -49°42'. This value gives the ideal resonance frequency-temperature characteristic which can be approximated with a cubic curve, and can be approximated with a straight line having a small inclination in the vicinity of room temperature. Further, the larger the width-to-thickness ratio Yo/Zo becomes, the larger the quadratic temperature coefficient "$\beta$" becomes, and thereby this characteristic is shifted from the cubic curve to the quadratic curve, and if the width-to-thickness ratio Yo/Zo becomes more than 0.3, the resonance frequency characteristic is able to to approximated with the quadratic curve in the vicinity of room temperature.

Figure 15:
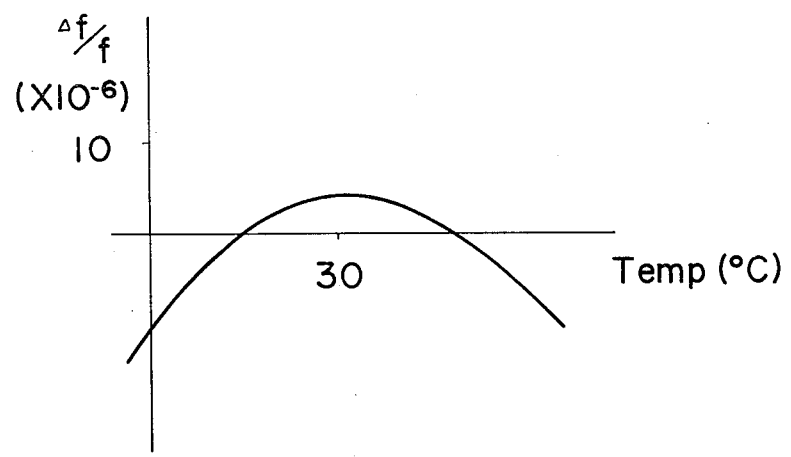
FIG. 15 is a diagram showing another example of the theoretical frequency-temperature characteristic of this invention.

FIG. 15 shows the resonance frequency-temperature characteristic under the condition of Yo/Zo=0.3, $\theta_1 = 35°12'$ and $\theta_2 = -50°12'$, which can be approximated with the quadratic curve in the vicinity of room temperature and also the value of "$\beta$" is about $-1.2 \times 10^{-8}/°C.^2$ according to the theoretical computation. Namely, the value of "$\beta$" should be smaller than the said value for realizing a highly accurate wrist watch by using a single quartz crystal vibrator. And since the resonance frequency is determined by the equation (6), if a metal such as Au, Ag or Al is adhered to the side surface thereof, Zo virtually becomes larger and as a result the resonance frequency "f" can be adjusted.

As described above, this invention enables the vibrator to be excited at the vibration mode (1, 1, 1) which had been considered to be impossible, by improving the electrode construction of the thickness-width shear quartz crystal vibrator. By this, the equivalent impedance is made very small. Further, according to the present invention, thickness-width shear quartz crystal vibrator having excellent resonance frequency-temperature characteristic can be gained by analyzing the resonance frequency-temperature characteristic thereof theoretically, and particularly, by selecting the cut-out angles and width-to-thickness ratio thereof suitably. Furthermore, the frequency can be easily adjusted without deterioration of the equivalent impedance of the quartz crystal vibrator. By the aboved mentioned characteristics of the quartz crystal vibrator according to the present invention, a highly accurate wrist watches is realized.

I claim:

1. A thickness-width shear quartz crystal vibrator cut out from the a Y-plate of quartz crystal at the angle of 34 to 36 degrees truned around the X'-axis thereof, wherein respective pairs of spaced electrodes are respectively provided on the main surfaces thereof which are penpendicular to the Y'-axis thereof, said spaced electrodes provided on each main surface having a different polarity and spaced in the width dimensions of the vibrator, and frequency-adjusting elements adhered to the side surfaces on which said electrodes not being provided; and the width-to-thickness ratio Yo/Zo thereof is less than 0.3, where Yo is the thickness of the vibrator and Zo is the width of the vibrator.

2. A thickness-width shear quartz crystal vibrator comprising: a quartz crystal vibrator plate cut from a Y-plate of quartz crystal at an angle of about 34 to 36 degrees rotated around the X'-axis of the Y-plate and having a pair of main surfaces defining the thickness dimension of the quartz crystal vibrator plate between them and with the width dimension of the quartz crystal vibrator plate defined in the direction of the Z'-axis of the Y-plate; two pair of electrodes, wherein each pair of electrodes is disposed on a respective one of the main surfaces of the quartz crystal vibrator plate with the electrodes of each pair spaced from each other along the width dimension of the quartz crystal vibrator plate; and means defining a pair of electrode terminals for receiving in use an electrical potential thereacross and for applying the electrical potential to the two pairs of electrodes so that the two electrodes of each pair on the same main surface have opposite electrical polarities to develop a thickness-width shear mode of vibration.

3. A thickness-width shear quartz crystal vibrator as claimed in claim 2, wherein the main surfaces defining the thickness dimension are perpendiuclar to the Y'-axis, each two electrodes are respectively provided on the said main surfaces perpendicular to the Y'-axis thereof and the end portion of said electrodes are arranged aligned in parallel with the Y'-axis thereof.

4. A thickness-width shear quartz crystal vibrator as claimed in claim 3, wherein the side surfaces thereof which are not provided with electrodes are cut out at the angle within the range of $-49$ to $-52$ degrees from the Z-axis thereof.

5. A thickness-width shear quartz crystal vibrator as claimed in claim 4, wherein a width-to-thickness ratio Yo/Zo thereof where Yo is the thickness of said vibrator, Zo is the width thereof, is less than the value of 0.3.

* * * * *